United States Patent
Jeschke et al.

(10) Patent No.: US 10,277,005 B2
(45) Date of Patent: Apr. 30, 2019

(54) PUMPED EDGE EMITTERS WITH METALLIC COATINGS

(71) Applicant: Palo Alto Research Center Incorporated, Palo Alto, CA (US)

(72) Inventors: Jorg Jeschke, Berlin (DE); Thomas Wunderer, Santa Cruz, CA (US); Mark Teepe, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/703,534

(22) Filed: Sep. 13, 2017

(65) Prior Publication Data
US 2019/0081457 A1    Mar. 14, 2019

(51) Int. Cl.
| | | |
|---|---|---|
| *H01S 3/0959* | (2006.01) | |
| *H01S 5/028* | (2006.01) | |
| *H01S 5/04* | (2006.01) | |
| *H01S 5/32* | (2006.01) | |
| *H01S 5/20* | (2006.01) | |
| *H01S 5/40* | (2006.01) | |

(52) U.S. Cl.
CPC .......... *H01S 5/0287* (2013.01); *H01S 3/0959* (2013.01); *H01S 5/04* (2013.01); *H01S 5/2018* (2013.01); *H01S 5/3211* (2013.01); *H01S 5/4031* (2013.01)

(58) Field of Classification Search
CPC ........ H01S 5/04; H01S 5/0287; H01S 3/0959; H01S 5/4031; H01S 5/2018; H01S 5/3211
See application file for complete search history.

(56) References Cited

U.S. PATENT DOCUMENTS

| | | | | |
|---|---|---|---|---|
| 4,731,792 A | * | 3/1988 | Shimizu | H01S 5/0014 372/46.012 |
| 4,751,710 A | * | 6/1988 | Yamaguchi | H01S 5/0264 372/44.01 |
| 6,611,543 B2 | | 8/2003 | Hwang | |
| 7,800,753 B1 | * | 9/2010 | Hug | G01J 3/10 356/301 |
| 7,856,043 B2 | | 12/2010 | Kim et al. | |
| 8,964,796 B2 | | 2/2015 | Wunderer et al. | |
| 9,118,162 B2 | | 8/2015 | Deppe | |
| 2001/0043636 A1 | * | 11/2001 | Bewley | B82Y 20/00 372/70 |
| 2003/0026312 A1 | | 2/2003 | Clayton et al. | |

(Continued)

OTHER PUBLICATIONS

Tabata-Vakili et al., "Dominance of radiative recombination from electron-beam-pumped deep-UV AlGaN multi-quantum-well heterostructures", Applied Physics Letters 109, 2016, 181105-181105-5.

*Primary Examiner* — Yuanda Zhang
(74) *Attorney, Agent, or Firm* — Hollingsworth Davis, LLC

(57) ABSTRACT

An edge emitting structure includes an active region configured to generate radiation in response to excitation by a pumping beam incident on the structure. A front facet of the edge emitting structure is configured to emit the radiation generated by the active region. A metallic reflective coating disposed on at least one of the front and rear facets of the edge emitting structure. The metallic reflective coating is configured to reflect the radiation generated by the active region.

18 Claims, 6 Drawing Sheets

(56) References Cited

U.S. PATENT DOCUMENTS

| | | | |
|---|---|---|---|
| 2008/0089377 A1* | 4/2008 | Fukuda | H01S 5/028 372/49.01 |
| 2013/0032825 A1 | 2/2013 | Wasserbauer | |
| 2014/0369367 A1 | 12/2014 | Wunderer et al. | |
| 2016/0315449 A1* | 10/2016 | Shatalov | H01S 5/04 |

* cited by examiner

PUMPED EDGE EMITTERS WITH METALLIC COATINGS

STATEMENT REGARDING FEDERALLY SPONSORED RESEARCH AND DEVELOPMENT

This invention was made with Government support under Contract No. HR0011-15-C-0025 DARPA-LUSTER Program awarded by DARPA. The Government has certain rights in this invention.

BACKGROUND

Semiconductor devices can be fabricated to emit radiation at various wavelengths, spanning the visible light spectrum to ultraviolet radiation. Ultraviolet radiation (UVR) emitting devices are of considerable interest for applications that include water purification, analytical devices for medical and biotechnology fields, UVR curing, and currency screening, among other applications. Radiation emitting devices that emit in spectral ranges suitable for these and other applications can be fabricated based on a variety of semiconductor material systems.

SUMMARY

An edge emitting structure includes an active region configured to generate radiation in response to excitation by a pumping beam incident on the structure. A front facet of the edge emitting structure is configured to emit the radiation generated by the active region. A metallic reflective coating disposed on at least one of the front and rear facets of the edge emitting structure. The metallic reflective coating is configured to reflect the radiation generated by the active region.

Some embodiments are directed to a method for making an edge emitting structure. The method includes forming an active region configured to generate radiation in response to excitation by a pumping beam incident on the structure. One or both of the front and rear facets of the edge emitting structure are coated with a metallic reflective coating. The metallic reflective coating is configured to reflect the radiation generated by the active region.

Some embodiments are directed to a method for operating a edge emitting structure. An active region is pumped with a pumping beam. In response to the pumping, the active region generates radiation. The radiation is reflected from a metallic coating disposed on one or both of front and rear facets of the edge emitting structure. The radiation is emitted through the front facet.

These and other aspects of the present application will be apparent from the description below. In no event, however, should the above summaries be construed as limitations on the claimed subject matter, which subject matter is defined solely by the attached claims.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION

Figure 1A:
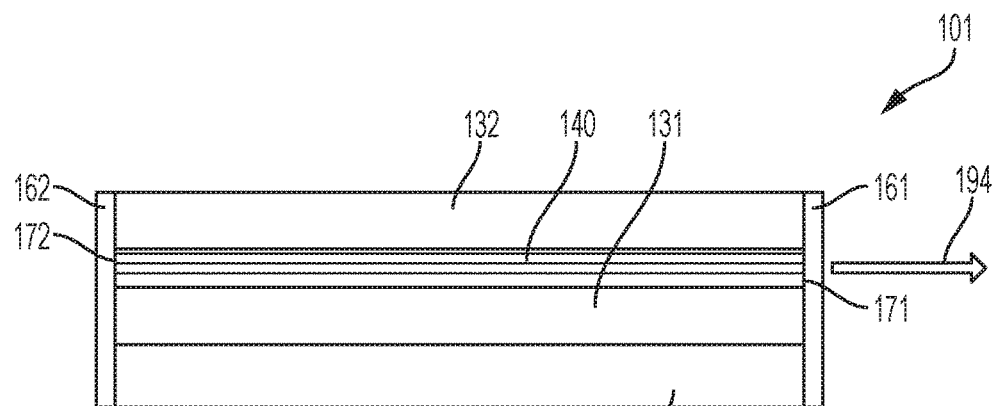
FIG. 1A is a diagram that illustrates an edge emitting structure in accordance with some embodiments.

FIG. 1A is a diagram illustrating an edge emitting structure 101 configured to emit radiation in response to excitation by a pumping beam incident on the edge emitting structure 101. An edge emitter is one in which the generated radiation propagates in a direction along the wafer surface of the semiconductor chip is coupled out at a cleaved edge, referred to herein as a facet. According to some embodiments, the structure 101 shown in FIG. 1A may be a spontaneous edge emitting structure that spontaneously emits radiation in response to the excitation beam pumping. In other embodiments, the structure 101 may produce stimulated radiation emission in response to the excitation beam pumping.

Depending on the materials used to form the structure 101, the radiation emitted by edge emitting structure 101 may be in the visible light wavelength range, e.g., between about 400 nm to about 700 nm or may be ultraviolet radiation (UVR), e.g., having wavelengths less than 400 nm, less than 300 nm, or even less than 280 nm, for example.

The structure 101 includes an active region 140 optionally disposed on a substrate 110. In some embodiments, the substrate 110 may comprise AlN or an AlN template on sapphire or other materials such as Si, SiC, etc. AlN templates on sapphire substrates can be prepared by an epitaxial-lateral overgrowth (ELO) technique to achieve a low dislocation-density base layer.

In some embodiments, the active region 140 may comprise a single layer of material. For example, when the structure 101 is configured as a spontaneous radiation emitter, region 140 may be a single layer of radiation emitting material, such as AlGaN, having a thickness between about 50 nm to about 5 μm. Alternatively, the active region 140 of a spontaneous or stimulated radiation emitter may comprise quantum well structures that include one or more layers of radiation emitting material disposed between barrier layers. In some embodiments, the active region 140 can include about ten quantum well structures, each quantum well structure comprising at least one quantum well layer disposed between barrier layers. In an embodiment, of a spontaneous radiation emitter, the active region 140 comprises $Al_{0.56}Ga_{0.44}N$ quantum well regions disposed between $Al_{0.9}Ga_{0.1}N$ barrier layers. Such a active region may be grown by metal organic vapor phase epitaxy (MOVPE). The thickness of the quantum well layers may be between about 0.5 nm to about 10 nm, e.g., about 1.5 nm, and the thickness of the barrier layers may be between about 2 to about 200 nm, e.g., about 40 nm in this embodiment. The total thickness of the active zone may be tailored to the energy deposition profile of the high energy electrons when electron beam pumping is used as excitation method. The optimal thickness is dependent on the energy of the e-beam and might range from about 50 nm to several microns.

Suitable materials for radiation emission of the active region are group III-V, and II-VI compound semiconductors providing a direct band gap. This includes group III-Nitrides e.g., AlGaInN, including B, BAlGaInN), group III-Arsenides (AlGaInAs), group III-Phosphides (AlGaInP), group III-Sb, and various II-VI compounds, such as ZnO, ZnS, ZnSe, and combinations thereof. Suitable materials also include diluted semiconductor materials, where part of the group V elements are mixed, e.g., GaNAs, etc. In some embodiments, the radiation emitting structures disclosed herein may include III-N materials, such as GaN, as well as GaAs, AlGaAs, InGaAs, GaP, InGaP, InP, and GaInP.

The active region 140 is configured to emit radiation 194 from a front facet 171 of the structure 101 in response to an excitation pump beam incident on the structure. Reflective coatings 161, 162 can be disposed on one or both of the front facet 171 and the rear facet 172 of the structure 101. The structure 101 is edge emitting and the facets 171 are non-parallel with the plane of the active region. The reflective coatings 161, 162 may be metallic, including aluminum or aluminum alloys, or other types of metal. In some embodiments, each reflective coating 161, 162 is a single layer of metal, such as a single layer of non-annealed Al. The reflective coatings 161, 162 may extend to cover only portions of the facets 171, 172, e.g., the edges of the emitting region 140 or the edges of the emitting region 140 and the edges of the waveguides. In some embodiments, the reflective coatings 161, 162 may extend to cover substantially all of one or both facets 171, 172 as shown in FIG. 1A. While aluminum has the highest reflectivity in the ultraviolet radiation range, other metals could be used for devices emitting in other wavelength regions (e.g. silver or gold for the infrared).

Radiation generated by the active region 140 in response to the pumping is reflected by the reflective metallic coatings 161, 162. The high reflectivity of the metallic coatings is achieved when being deposited on smooth, mirror-like surfaces. High reflectivities exceeding 90% can be achieved with a single metal film due to the electrically conductive nature of the metal. The use of reflective metallic layers is much simpler than relying on constructive interference of multiple reflections at a multi-layered dielectric Distributed Bragg Reflector (DBR), for example.

The edge emitting structure 101 optionally includes a radiation guiding region comprising a lower waveguide 131 disposed over the substrate 110 and an upper waveguide 132. The radiation waveguides 131, 132 may be omitted if the edge emitting structure 101 is a spontaneous radiation emitter and may be included if the edge emitting structure 101 is a stimulated radiation emitter. When the waveguides 131, 132 are present, the active region 140 may be disposed between the lower waveguide 131 and the upper waveguide 132.

Figure 1B:
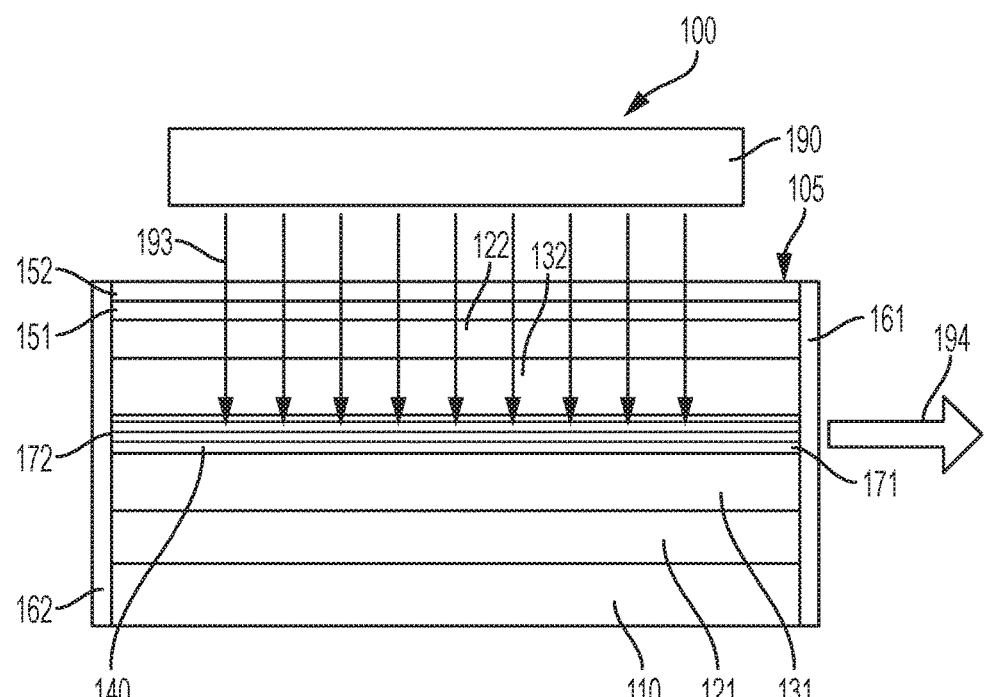
FIG. 1B is a diagram of a system that includes an edge emitting structure and an pump source that provides pumping radiation in accordance with some embodiments.

FIG. 1B is a diagram of a system 100 that includes an edge emitting structure 105 and a pump source 190 that provides pumping beam 193. The pump source 190 may be an optical source that provides an optical pumping beam or may be an electron beam source that provides an electron pumping beam. The edge emitting structure 105 comprises a substrate 110, such as AlN or GaN. An optional lower cladding layer 121 is disposed on the substrate 110. An upper cladding layer 122 may be disposed on the opposite side of the active region 140. The lower may not be needed when the edge emitting structure 105 is a spontaneous emitter. When used, the lower cladding layer 122 may comprise $Al_xGa_{1-x-y}In_yN$, wherein x is between 0.6 and 1 and y is between 0 and 0.3. In some embodiments, the lower cladding layer 121 comprises n doped $Al_{0.74}Ga_{0.26}N$. In some embodiments, an optional upper cladding layer 122 is present.

An optional lower waveguide 131 may be formed over the lower cladding layer 121. In some embodiments, the lower waveguide 131 comprises $Al_zGa_{1-z-y}In_yN$ where z is between 0.5 and 1, y is between 0 and 0.03, and z<x. For example, in some embodiments, the lower waveguide 131 may comprise n-doped $Al_{0.7}Ga_{0.3}N$ having a thickness of about 40 nm. One or both of the lower waveguide 131 and the lower cladding layer 121 may be n-doped.

The emitting region 140 may be a single layer emitter or a multiple quantum well (MQW) heterostructure formed over the lower waveguide 131, for example. Active emitting region 140 may comprise quantum well-barrier pairs with the quantum well layers comprising $Al_xGa_{1-x}N$ and the barrier layer comprising $Al_yGa_{1-y}N$. In some embodiments, the number of layer pairs is about 5, x is about 0.57 and y is about 0.62. The thickness of each quantum well layer may be about 5 nm and the thickness of each barrier layer may be about 9 nm. In general, the active region may comprise at least one layer of $Al_uGa_{1-u-v}In_vN$ wherein v is between 0 and 0.03 and 0.4<u<z. In embodiments in which the emitting region 140 includes multiple quantum wells, the barrier layers may be $Al_sGa_{1-s-t}In_tN$, where 0.4<u<z and s>u+0.04, and t is between 0 and 0.03. For example, the quantum well layer thickness may be between 1 and 6 nm and the barrier layer thickness may be between 2 and 20 nm.

In some embodiments, the upper waveguide 132 comprises n-doped AlGaN. The upper waveguide 132 may comprise a layer of n-$Al_{0.7}Ga_{0.3}N$ that is about 40 nm thick, for example. Optionally, upper cladding layer 122 may be formed over upper waveguide 132. When the upper cladding layer is not used and the upper waveguide 132 is present, the upper waveguide 132 may be relatively thick, e.g., on the order of about 200 nm for example. When an upper cladding layer 122 is included, the layer 122 may comprise n-doped AlGaN (such as having at least 70% Al, for example an n-$Al_{0.78}Ga_{0.22}N$ layer that is 220 nm thick). In some embodiments, such as when the upper cladding layer has a high Al concentration, e.g., greater than 0.8, the upper cladding layer 122 may be undoped. In some embodiments, at least one of the lower cladding layer 121, lower waveguide layer 131, emitting region 140, upper waveguide layer 132, and upper cladding layer 122 is doped n-type.

Optionally, in some embodiments, at least one of the lower cladding layer 121, lower waveguide layer 131, emitting region 140, upper waveguide layer 132, and upper cladding layer 122 is a short-period superlattice. In addition, in certain embodiments, at least one of the lower cladding layer 121, lower waveguide layer 131, upper waveguide layer 132, or upper cladding layer 122 may having a monotonically-varying alloy-compositional gradient, with the lower band gap composition of the graded layer nearest the radiation emitting layer. Alternatively, in certain embodiments, at least one of the lower cladding layer 121, lower waveguide layer 131, upper waveguide layer 132, or upper cladding layer 122 may have a monotonically-varying alloy-compositional gradient, with the higher band gap composition of the graded layer nearest the radiation emitting layer.

The structure 105 shown in FIG. 1B includes metallic reflective coatings 161, 162 on one or both of the front 171 and rear facets 172 of the structure 105. The reflectivity of the metallic reflective coating can be greater than about 20% and less than about 90% at wavelengths of the emitted radiation. A metallic coating may be disposed only on the rear facet or on both the front and rear facets. In some embodiments, the coating on the rear facet may be an aluminum coating having a thickness of about 1 to about 300 nm, or between about 50 to about 200 nm, e.g., about 100 nm. The coating on the front facet is thin enough to allow the radiation generated in the device to exit the device. In some embodiments, the coating on the front facet may be an aluminum coating having a thickness of about 1 nm to about 100 nm, or between about 5 nm to about 50 nm, or between about 10 to about 30 nm, e.g., about 20 nm.

Each of the reflective coatings 161, 162 may be coating applied in one single layer to the facet. In some implementations, a reflective coating may be disposed only on the rear facet, in some implementations a reflective coating may only be disposed on the front facet, and in some implementations, reflective coatings may be disposed on both front and rear facets. When reflective coatings are disposed on both front and rear facets, the thickness of the coating on the front facet may be less than the thickness of the coating on the front facet. For example, in some embodiments, the thickness of the front metallic coating is about 0.1 to about 0.2 times the thickness of the rear metallic coating. In some embodiments reflectivity of the metallic reflective coating on the rear facet at wavelengths of the emitted radiation may be between about 80% to about 90%. Reflectivity of the metallic reflective coating on the front facet at the wavelengths of the emitted radiation may be between about 20% to about 70%.

Metal thicknesses on the front and rear facet can be varied depending on the desired reflectivity. The front facet could be uncoated. The metal thickness on the front facet is only limited by the light absorption which would totally block the radiation emission beyond a certain thickness. For example, a reflective Al layer about 40 nm thick would block radiation at 250 nm emission wavelength.

The III-N material compositions described above are relevant for an example device that emits in the ultraviolet radiation range. However, metal reflective coatings on the front and/or rear facets of pumped, edge emitting devices of any wavelength range are useful, including devices emitting light in the visible range, e.g., green, blue, and red by spontaneous or stimulated emission.

The semiconductor structures as disclosed herein may be pumped by an optical beam or an electron beam and thus do not rely on a p/n junction for carrier generation. Thus, according to some embodiments, the active regions of the edge emitting structures described herein are not embedded between the p and n-type layers of a p/n junction. Embodiments disclosed herein involve the use of an optical or electron beam as an excitation source to take advantage of the fact that generation of carriers by optical or beam means that carrier generation and injection does not rely on a p/n-junction. This obviates the challenge of forming a highly conductive (p-type) material in high band gap semiconductors that is able to carry the current densities necessary for radiation emission. Thus, no p-type doping of an upper cladding layer is required. In addition, carrier injection by electron beam pumping is comparatively deep, extending beyond the top most MQW layers. This homogeneous carrier injection supports an increased number of quantum wells in the MQW layer than typically is achieved in a laser diode. Higher gain and enhanced device performance are thereby provided.

Electron beam pumping produces a net charge within the device structure. Thus, in accordance with some embodiments, light emitting structures disclosed herein include features to allow effective discharge of the structure. For example, device structures may include conductive layers that are n-doped (and may include p-doped layers), metal films and/or contacts and connections to ground or the anode of the electron beam source.

Optionally, as shown in FIG. 1B, the light emitting device structure 101, 105 may include a contact layer 151 over the cladding layer 122, or over the upper waveguide layer 132 if no cladding layer is used, to provide a discharge path for excess charges accumulating due to electron beam pumping. The contact layer 151 may comprise n-(Al)GaN as one example. A suitable ohmic metal contact layer 152 such as a Ti layer, may be formed over contact layer 151. The ohmic metal layer 152 is thin such that the electron beam can easily penetrate into the emitting region 140 of the structure 101. The contact layer 151 and ohmic metal layer 152 permit conduction of charge from the structure 105 and do not induce extensive absorption losses for the laser mode.

Figure 2A:
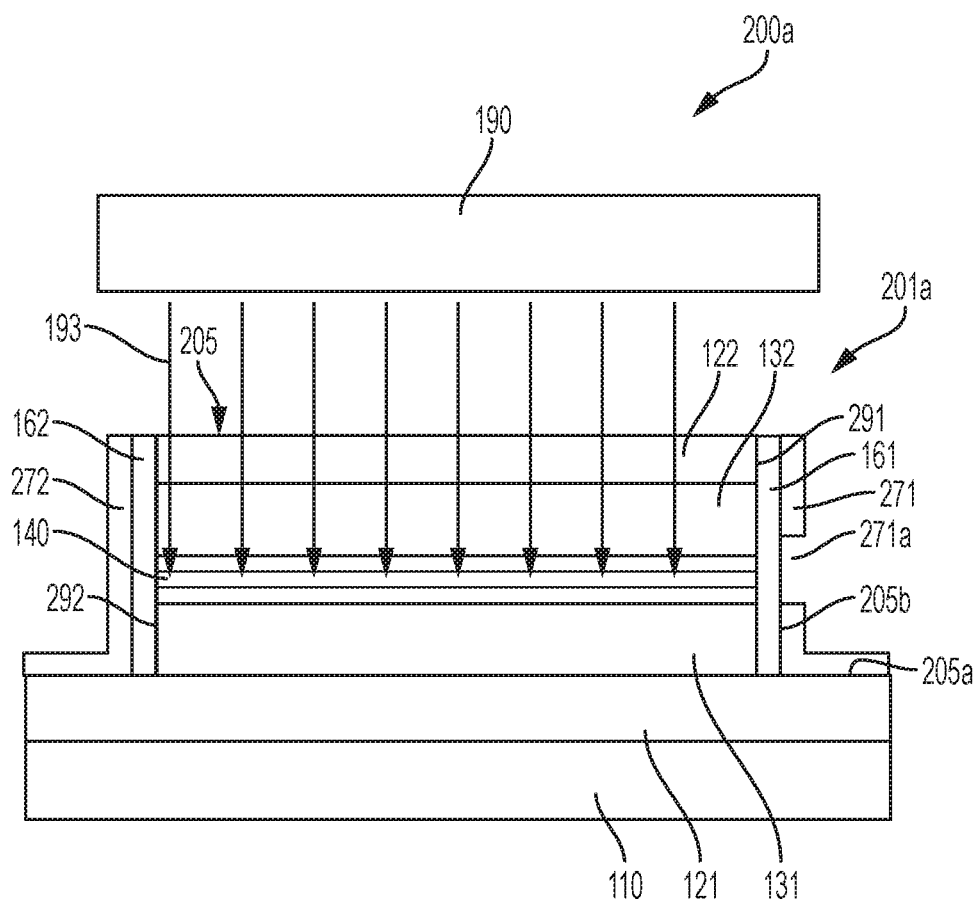
FIGS. 2A and 2B are diagrams of a system that includes mesa structure in accordance with some embodiments.

Optionally, as shown in system 200a of FIG. 2A, the edge emitting structure 201a may not include a top contact layer and/or a top ohmic metal contact layer. In these embodiments, the upper cladding layer 122 may comprise undoped AlN having a thickness of about 120 nm. Lower absorption losses may be obtained for a thinner upper cladding layer (about 120 nm) as compared to the thicker cladding layer (about 220 nm) described above as used in conjunction with the contact layer and ohmic metal contact layer (FIGS. 1A and 1B). The lack of a contact layer and ohmic metal contact layer means that the discharge of the device is provided not via these layers on the top side of the light emitting structure, but instead optionally through the n-AlGaN lower cladding layer 121 and/or optionally laterally via the front and rear contacts 271, 272 disposed respectively on the front and rear sides (facets) 291, 292 of the light emitting structure 201a (shown in FIG. 2A) or side contacts 273, 274 disposed respectively on the right side and left sidewalls 293, 294 of the light emitting structure 201b shown in FIG. 2B). The rear metal contact 272 may partially or fully cover the rear metal reflective coating 162 as shown in FIG. 2A. The front metal contact 271, if used, partially covers the front metal reflective coating 161, with a suitable opening 271a that allows the radiation generated by the structure 201a to emerge. The discharge contacts 271, 272, 273, 274 may comprise a layered metal structure such as Ti/Al/Ti/Au. According to some embodiment, the discharge contacts 271, 272, 273, 274 are annealed at elevated temperatures to form a good ohmic contact.

In embodiments in which a top contact layer is used for electron discharge, the excess carriers created by the electron beam discharge via the top surface of the light emitting structure. Therefore the AlGaN composition of the cladding layer may be limited to provide sufficiently high conductivity (e.g., the Al-composition may be about 78%). To avoid high absorption losses through the GaN contact layer and/or metal ohmic contact, the upper cladding layer may be chosen to be relatively thick, on the order of 220 nm.

Figure 2B:
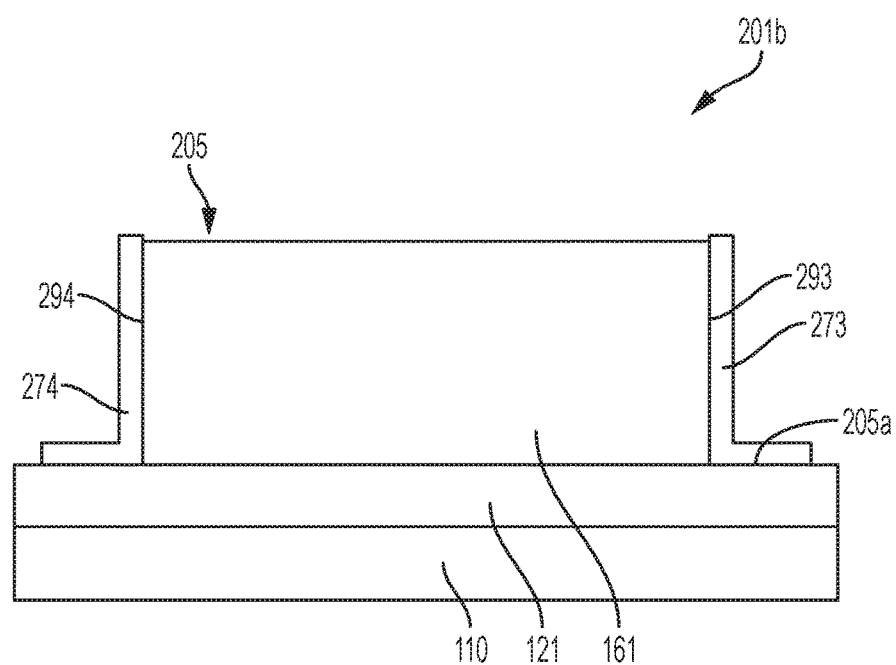

However, in embodiments in which the contact and ohmic contact layers are not present, as in FIGS. 2A and 2B, the upper cladding layer 122 may be non-conductive, e.g., the upper cladding layer may be non-conductive AlN. Furthermore, by reducing the thickness of the AlN upper cladding layer, carrier generation and confinement within the quantum well active region may be enhanced. Thus, the upper cladding layer may be selected, as an example, to be on the order of 120 nm thick.

In some embodiments, the light emitting structure may be etched, e.g., to form a mesa 205, as shown in FIGS. 2A and 2B, to expose the lower cladding layer 121 for electrical contact. Metal contacts 271-274 may be deposited on selected portions of the exposed surfaces of the mesa, either at the bottom of the etched region 205a adjacent the mesa 205 or on one or more of the facets or sidewalls 291-294 of the mesa 205, or both, for the discharge conduction path. A contact layer and/or top metal ohmic layer are not needed in this design.

The pump source 190 is disposed over, and in some embodiments, spaced apart and/or separate from from a top surface of light emitting structure 101, 105, 201. The pump source may be an optical beam or electron beam. When the pump source 190 is an electron beam source, the pump source 190 may be connected to a driving voltage such that it produces a line-pattern (e.g., 20 μm×500 μm) electron beam 193 in a direction toward and into the top surface of light emitting structure 101, 105, 201. Ultraviolet radiation emission wavelengths for such a structure may be obtained, depending upon materials and compositions, for example in the range of about 200 nm to about 385 nm.

Some embodiments disclosed herein use aluminum coatings on one or both of the front and back facets of an electron beam pumped AlGaInN-based light emitting structure that emits radiation in the UV spectral range in response to the electron beam. The metallic coatings can be formed by e-beam deposition wherein the edge emitting structure is positioned at about 45° to the aluminum target to facilitate material deposition on the facet. Front and rear facets can be coated in two separate process steps differing in the orientation of the wafer and the deposited metal thickness.

For singulated devices with cleaved facets, the facets may be positioned in the evaporator facing the metal source instead of the 45° angle described above. Also, other evaporation methods (e.g. sputtering, thermal evaporation, plasma evaporation, etc.) can be used instead of the method of e-beam evaporation.

Figure 3:
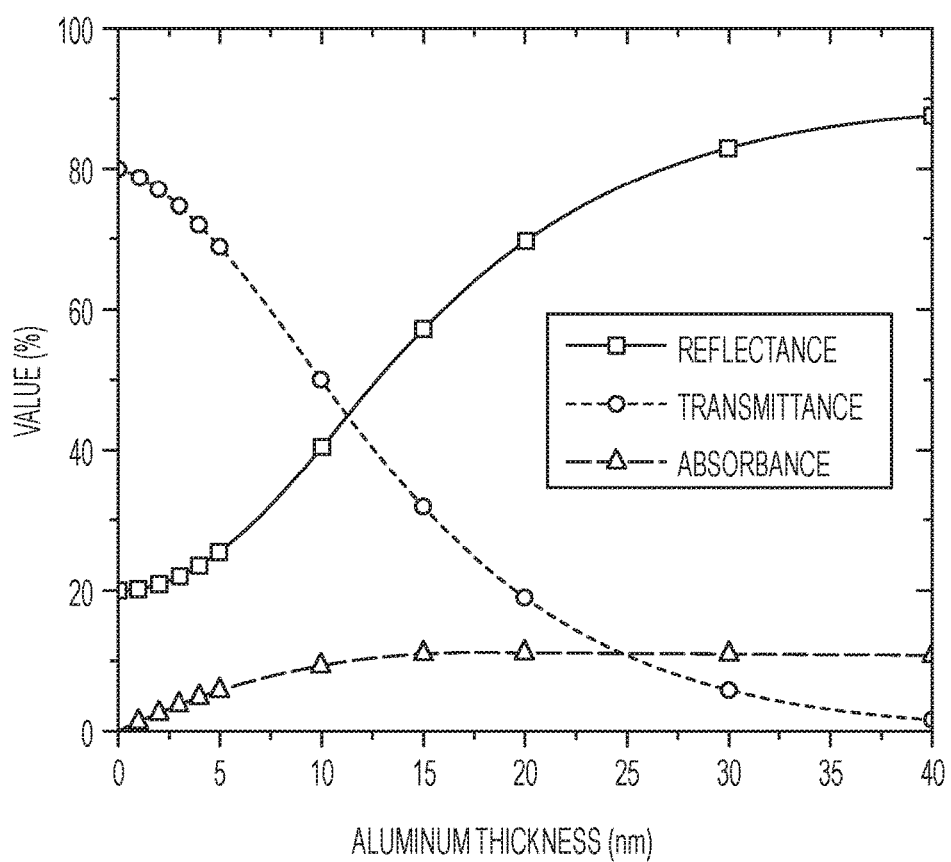
FIG. 3 shows the reflectance, transmittance, and absorbance of an aluminum layer on an $Al_{0.8}Ga_{0.2}N$ surface for a wavelength of 240 nm as a function of layer thickness.

The reflectivity of aluminum on AlGaN quickly increases with aluminum thickness from 20% for the bare facet to 90% for a 100 nm thick layer. FIG. 3 shows the reflectance, transmittance, and absorbance of an aluminum layer on an $Al_{0.8}Ga_{0.2}N$ surface for a wavelength of 240 nm as a function of layer thickness. In some embodiments, an aluminum layer of about 100 nm is deposited on the rear facet to reach a high reflectivity. On the front facet, through which the radiation generated by the device exits, a thinner layer of about 10 to about 20 nm may be deposited, providing a reflectivity to about 40 to about 70% while still maintaining a transmissivity of about 50% to about 19% for the radiation emitted from the active region.

Figure 4:
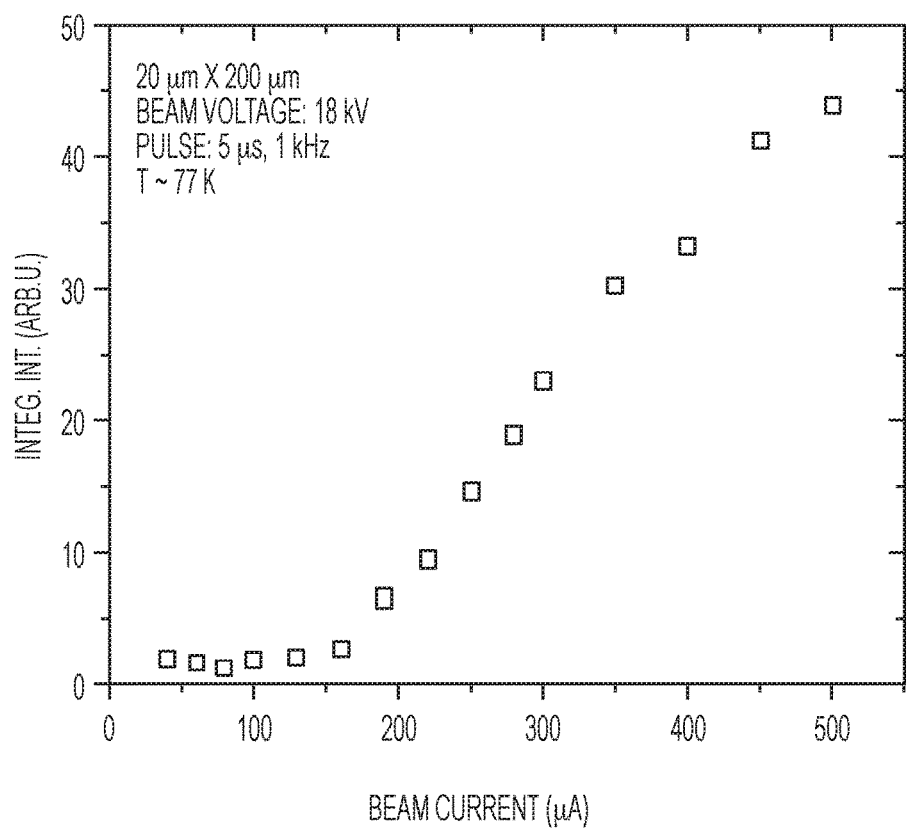
FIG. 4 shows the light-current (LI) curve for a UVR laser structure in accordance with some embodiments.
Figure 5:
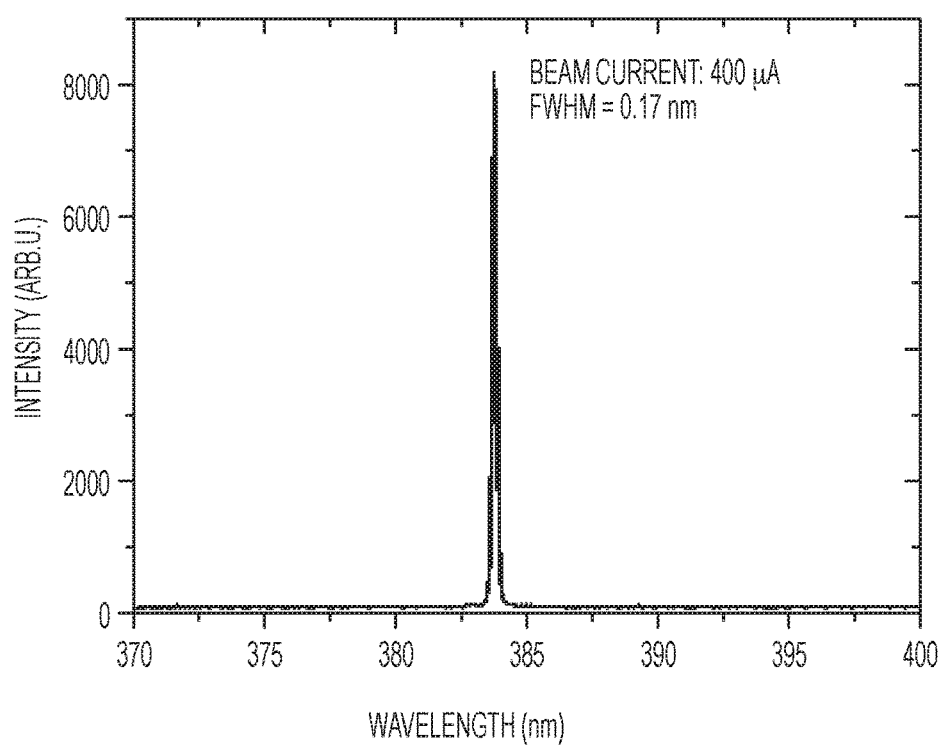
FIG. 5 shows the laser emission spectrum of a laser structure in accordance with some embodiments.

Laser emission at a wavelength of 383 nm has successfully been demonstrated for an electron beam pumped edge emitting semiconductor laser structure with an aluminum coated rear facet and an uncoated front facet. FIG. 4 shows the light-current (LI) curve of integrated intensity (Integ. Int.) in arbitrary units vs. beam current in μA for a UVR laser device with a 200 μm cavity length, 100 nm thick Al coated rear facet and uncoated front facet. The e-beam voltage was 18 kV, 5 μsec pulses were emitted at a frequency of 1 kHz. Laser threshold current is about 174 μA under pulsed operation at low temperature. FIG. 5 shows the laser emission spectrum of the laser structure where the e-beam current was set to 400 μA. The full width half maximum (FWHM) of the laser line is 0.17 nm for this device.

It will be understood from the above that incorporating an electron beam as an excitation source provides for carrier generation and injection that do not rely on a p-n junction (an interface between p-type material and n-type material). This addresses the significant challenge of creating highly conductive (p-type) layers in high bandgap materials that are able to carry the current densities necessary for laser emission.

In addition, in traditional p-/n-junction devices, carrier injection into the active zone is typically problematic. In typical devices, the top-most quantum wells of the MQW region see a greater injection than the lower wells, and injection distribution in inhomogeneous. This often limits the number of quantum well layers formed in a semiconductor laser device, which affects device performance. However, according to the teachings of the present disclosure, a lasing structure may be produced requiring no p-type doping. Very homogeneous generation and deep injection into the active region be can be achieved.

While the above description has focused on structure compositions to produce devices with a target wavelength in the UVR range, other compositions (e.g., AlGaN), materials (e.g., InGaN) and material systems (group III-arsenides, group III-phosphides, group II-VI systems, etc.) can be substituted to obtain one or more of a wide range of target emission wavelengths, as will be appreciated by one skilled in the art from disclosure herein. Furthermore, in some embodiments, a relatively thick top waveguide optimized for electron beam energy deposition may be used without using a top cladding layer. In another alternative embodiment, the top cladding layer may be realized using low-loss non-epitaxial materials (e.g., $Al_2O_3$). Additional configurations of light emitting devices that are suitable for use with the metallic reflective coatings discussed herein are described in commonly owned U.S. Pat. No. 8,964,796 which is incorporated herein by reference. Additional information regarding discharge structures for electron beam pumped devices is disclosed in U.S. Pat. No. 9,112,332 which is incorporated herein by reference.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in radiation of the above teaching.

The invention claimed is:

1. An electron beam pumped edge emitting structure comprising:
   an active region configured to generate radiation in response to excitation by an electron pumping beam incident on the structure;
   a front facet configured to emit the radiation generated by the active region;
   a rear facet;
   a first side disposed between the front facet and the rear facet;
   an opposing second side disposed between the front facet and the rear facet;
   at least one metallic reflective coating comprising a metal layer disposed directly on one of the front and rear facets, the metallic reflective coating configured to reflect the radiation generated by the active region; and one or more contact layers configured to discharge electrons created by the electron pumping beam, each contact layer respectively disposed on one of the metallic reflective coating disposed directly on the front facet, the metallic reflective coating disposed directly on the rear facet.

2. The structure of claim 1 wherein the metallic reflective coating comprises an aluminum coating and the contact layer comprises a layered structure comprising Ti and Au.

3. The structure of claim 1 wherein the metallic reflective coating has a thickness of between about 1 nm and about 200 nm and the contact layer only partially covers the metallic reflective coating.

4. The structure of claim 2, wherein the aluminum coating is unannealed and the contact layer comprises a different metal than the aluminum coating.

5. The structure of claim 1 wherein the at least one metallic reflective coating is disposed only on the rear facet and the at least one contact layer fully covers the at least one metallic reflective coating.

6. The structure of claim 1 wherein the at least one metallic reflective coating comprises both a front metallic reflective coating disposed on the front facet and a rear metallic reflective coating disposed on the rear facet and wherein the at least one contact layer comprises a rear contact layer disposed on and fully covering the rear metallic reflective coating and a front contact layer disposed on and partially covering the front metallic reflective coating.

7. The structure of claim 6, wherein reflectivity of the rear metallic reflective coating at a wavelength of the radiation is between about 80% to about 90% and reflectivity of the front metallic reflective coating at the wavelength of the radiation is between about 20% to about 70% and the rear and front contact layers comprise a Ti layer, an Al layer and an Au layer.

8. The structure of claim 6 wherein:
the rear metallic coating has a thickness of about 100 nm; and
a thickness of the front metallic coating is less than a thickness of the rear metallic coating.

9. The structure of claim 1 further comprising upper and lower cladding layers, the active region disposed between the upper cladding layer and the lower cladding layer, wherein the upper cladding layer is non-conductive.

10. The structure of claim 9 wherein the upper cladding layer comprises AlN.

11. The structure of claim 6, wherein:
a thickness of the front metallic coating is between 1 nm and 100 nm; and
the thickness of the front metallic coating is about 0.1 to about 0.2 times the thickness of the rear metallic coating.

12. The structure of claim 1 wherein the radiation has a wavelength less than about 400 nm.

13. The structure of claim 1 wherein the radiation has a wavelength less than about 280 nm.

14. The structure of claim 1, the one or more contact layers comprises one or both of a front contact layer disposed on the metallic reflective coating disposed directly on the front facet and a rear contact layer disposed on the metallic reflective coating disposed directly on the rear facet.

15. The structure of claim 10, wherein the upper cladding layer has a thickness on the order of about 120 nm.

16. A method for operating an electron beam pumped edge emitting structure comprising:
pumping an active region with an electron pumping beam;
generating radiation in the active region in response to the pumping;
reflecting the radiation from at least one metallic coating comprising a metal layer disposed directly on one of a front facet and a rear facet of the edge emitting structure; and
emitting the radiation through the front facet; and
discharging excess electrons created in the structure by the electron pumping beam through one or more contact layers, each contact layer respectively disposed on one of the metallic coating disposed directly on the front facet and the metallic coating disposed directly on the rear facet.

17. The method of claim 16 wherein discharging excess electrons created by the pumping beam comprises discharging the excess electrons created in the structure through the metal layer.

18. The method of claim 17, wherein:
reflecting the radiation comprises reflecting the radiation from a rear metallic layer disposed on the rear facet and from a front metallic layer disposed on the front facet; and
discharging excess electrons comprises one or both of:
discharging excess electrons through the rear metallic layer and a rear contact layer that covers the rear metallic layer; and
discharging excess electrons through the front metallic layer and a front contact layer that only partially covers the front metallic layer.

* * * * *